United States Patent
Shibata

(10) Patent No.: US 9,568,312 B2
(45) Date of Patent: Feb. 14, 2017

(54) SENSOR DEVICE, MANUFACTURING METHOD OF SENSOR DEVICE AND ELECTRONIC APPARATUS

(71) Applicant: Seiko Epson Corporation, Tokyo (JP)

(72) Inventor: Tsunenori Shibata, Minowa (JP)

(73) Assignee: Seiko Epson Corporation (JP)

( * ) Notice: Subject to any disclaimer, the term of this patent is extended or adjusted under 35 U.S.C. 154(b) by 427 days.

(21) Appl. No.: 13/858,313

(22) Filed: Apr. 8, 2013

(65) Prior Publication Data

US 2013/0263660 A1  Oct. 10, 2013

(30) Foreign Application Priority Data

Apr. 10, 2012 (JP) ................. 2012-089666

(51) Int. Cl.
*G01C 19/56* (2012.01)
*G01C 25/00* (2006.01)
*G01C 19/5607* (2012.01)
*G01C 19/5628* (2012.01)

(52) U.S. Cl.
CPC .......... *G01C 19/56* (2013.01); *G01C 19/5607* (2013.01); *G01C 19/5628* (2013.01); *G01C 25/00* (2013.01); *Y10T 29/42* (2015.01)

(58) Field of Classification Search
CPC .................. G01C 19/5628; G01C 19/5663
USPC ...................................... 73/504.12
See application file for complete search history.

(56) References Cited

U.S. PATENT DOCUMENTS

| | | | |
|---|---|---|---|
| 6,462,530 B1 | 10/2002 | Layton | |
| 7,290,449 B2 | 11/2007 | Ao | |
| 7,400,078 B2 | 7/2008 | Takahashi et al. | |
| 7,583,012 B2 | 9/2009 | Nakashio et al. | |
| 7,723,905 B2 | 5/2010 | Takahashi et al. | |
| 2001/0020388 A1 | 9/2001 | Inoue et al. | |
| 2006/0230828 A1 | 10/2006 | Inoue et al. | |
| 2008/0222865 A1 | 9/2008 | Nakashio et al. | |
| 2008/0257044 A1 | 10/2008 | Watanabe et al. | |
| 2011/0146401 A1 | 6/2011 | Inaguma et al. | |

FOREIGN PATENT DOCUMENTS

| | | |
|---|---|---|
| EP | 1701132 A2 | 9/2006 |
| EP | 1847801 A2 | 10/2007 |
| JP | 2005-283424 | 10/2005 |
| JP | 2007-040961 | 2/2007 |
| JP | 2007-043054 | 2/2007 |
| JP | 4171217 | 8/2008 |
| JP | 2010-230691 | 10/2010 |
| JP | 2011-174940 | 9/2011 |
| WO | WO-2004-079296 A1 | 9/2004 |

OTHER PUBLICATIONS

European Office Action and Search Report for Application No. 13163059.2 dated Jul. 30, 2013.

*Primary Examiner* — John Chapman, Jr.

(74) *Attorney, Agent, or Firm* — Harness, Dickey & Pierce, P.L.C.

(57) ABSTRACT

A sensor device includes a first sensor element which detects an angular velocity around z axis and a second sensor element which detects an angular velocity around x axis, the relationship fd1>fd2 and fm1<fm2 is satisfied, when the drive frequency of the first sensor element is set to fd1, the drive frequency of the second sensor element is set to fd2, the mistuned frequency of the first sensor element is set to fm1, and the mistuned frequency of the second sensor element is set to fm2.

18 Claims, 10 Drawing Sheets

SENSOR DEVICE, MANUFACTURING METHOD OF SENSOR DEVICE AND ELECTRONIC APPARATUS

BACKGROUND

1. Technical Field

The present invention relates to a sensor device, a manufacturing method of a sensor device and an electronic apparatus.

2. Related Art

A sensor device which detects a physical amount such as an angular velocity and an acceleration is used in, for example, a vehicle body control in a vehicle, a vehicle position detection of a car navigation system, a vibration control and correction (so called, camera shake correction) of a digital camera and a video camera or the like. As the sensor device, for example, a sensor device which includes a plurality of sensor elements, and detects an angular velocities around two or three detection axes perpendicular to each other has been known (for example, refer to JP-A-2010-230691).

For example, a vibration gyro sensor described in JP-A-2010-230691 has two vibration elements (sensor elements) mounted on a supporting substrate in order to have different attitudes from each other and detects an angular velocities around two detection axes perpendicular to each other.

Further, in the vibration gyro sensor described in JP-A-2010-230691, since a difference between operation frequencies of two vibration elements is set to 1 kHz or more, it is possible to reduce the crosstalk of the drive signals or the detection signals between the vibration elements and thus raise the detection accuracy.

However, in the vibration gyro sensor described in JP-A-2010-230691, the difference between the noise levels of the sensor output of two vibration elements becomes large. As a result, for example, there is a problem that the accuracy of the vibration control and correction becomes different depending on the direction of the detection axis.

SUMMARY

An advantage of some aspects of the invention is to provide a sensor device and a manufacturing method of a sensor device capable of detecting angular velocities around a plurality of detection axes of directions intersecting with each other while reducing the difference between the noise levels of the sensor outputs of a plurality of sensor elements which are driven at the drive frequencies different with each other, and a highly reliable electronic apparatus including the above sensor device.

The invention can be implemented as the following forms or application examples.

APPLICATION EXAMPLE 1

This application example is directed to a sensor device including: a first sensor element which detects an angular velocity around a first detection axis; a second sensor element which detects an angular velocity around a second detection axis intersecting with the first detection axis, and relationship $fd1>fd2$ and $fm1<fm2$ is satisfied when a drive frequency of the first sensor element is set to $fd1$, a drive frequency of the second sensor element is set to $fd2$, a mistuned frequency of the first sensor element is set to $fm1$, and a mistuned frequency of the second sensor element is set to $fm2$.

In this case, it is possible to detect angular velocities around a plurality of detection axes of directions intersecting with each other while reducing the difference between the noise levels of the sensor outputs of a plurality of sensor elements which are driven at the drive frequencies different with each other.

APPLICATION EXAMPLE 2

In the sensor device according to the application example, it is preferable that a difference between a noise density of a sensor output of the first sensor element and a noise density of a sensor output of the second sensor element is 0[deg·s−1/√Hz] or more and 0.0003 [deg·s−1/√Hz] or less.

With this configuration, it is possible to make the noise densities of the sensor outputs of the first sensor element and the second sensor element substantially equal.

APPLICATION EXAMPLE 3

In the sensor device according to the application example, it is preferable that a difference between a drive frequency $fd1$ of the first sensor element and a drive frequency $fd2$ of the second sensor element is 3 kHz or more and 30 kHz or less.

With this configuration, it is possible to effectively reduce the crosstalk of the drive signals or the detection signals between the first sensor element and the second sensor element.

APPLICATION EXAMPLE 4

In the sensor device according to the application example, it is preferable that relationship $fd1<fs1$ and $fd2<fs2$, or $fd1>fs1$ and $fd2>fs2$ is satisfied, when a detection frequency of the first sensor element is set to $fs1$ and a detection frequency of the second sensor element is set to $fs2$.

With this configuration, it is possible to easily design the first sensor element and the second sensor element.

APPLICATION EXAMPLE 5

In the sensor device according to the application example, it is preferable that the first sensor element and the second sensor element each has a base portion, a vibrating arm which is extended from the base portion and is caused to drive and vibrate, and a mass adjusting film provided in the vibrating arm.

In the first sensor element and the second sensor element, by removing at least apart of the mass adjusting film, it is possible to easily adjust the drive frequency, the detection frequency and the mistuned frequency.

APPLICATION EXAMPLE 6

In the sensor device according to the application example, it is preferable that the first sensor element and the second sensor element each has a detection vibrating arm which is extended from the base portion, and in which the detection vibration is excited.

In the first sensor element and the second sensor element, it is possible to adjust respectively the drive frequency and the detection frequency. Therefore, it is possible to easily adjust the mistuned frequency.

APPLICATION EXAMPLE 7

In the sensor device according to the application example, it is preferable that the first detection axis and the second detection axis are perpendicular to each other.

With this configuration, it is possible to very accurately detect the angular velocities around two detection axes perpendicular to each other with a simple configuration.

APPLICATION EXAMPLE 8

In the sensor device according to the application example, it is preferable to include a third sensor element which detects an angular velocity around a third detection axis intersecting with the first detection axis and the second detection axis, and that relationship fd1>fd2>fd3 and fm1<fm2<fm3 is satisfied when a drive frequency of the third sensor element is set to fd3 and a mistuned frequency of the third sensor element is set to fm3.

With this configuration, it is possible to detect angular velocities around three detection axes intersecting with each other while reducing the difference between the noise levels of the sensor outputs of three sensor elements which are driven at the drive frequencies different from each other.

APPLICATION EXAMPLE 9

In the sensor device according to the application example, it is preferable that a difference between a noise density of a sensor output of the second sensor element and a noise density of a sensor output of the third sensor element is 0 [deg·s-1/√Hz] or more and 0.0003 [deg·s-1/√Hz] or less.

With this configuration, it is possible to make the noise densities of the sensor outputs of the second sensor element and the third sensor element substantially equal.

APPLICATION EXAMPLE 10

In the sensor device according to the application example, it is preferable that a difference between a drive frequency fd2 of the second sensor element and a drive frequency fd3 of the third sensor element is 3 kHz or more and 30 kHz or less.

With this configuration, it is possible to effectively reduce the crosstalk of the drive signals or the detection signals between the second sensor element and the third sensor element.

APPLICATION EXAMPLE 11

In the sensor device according to the application example, when a detection frequency of the second sensor element is set to fs2 and a detection frequency of the third sensor element is set to fs3, it is preferable that relationship fd2<fs2 and fd3<fs3, or the relationship fd2>fs2 and fd3>fs3 is satisfied.

With this configuration, it is possible to easily design the second sensor element and third sensor element.

APPLICATION EXAMPLE 12

This application example is directed to a manufacturing method of a sensor device which includes a first sensor element which detects an angular velocity around a first detection axis and a second sensor element which detects an angular velocity around a second detection axis intersecting with the first detection axis, and in which relationship fd1>fd2 is satisfied when a drive frequency of the first sensor element is set to fd1 and a drive frequency of the second sensor element is set to fd2, the manufacturing method including: preparing the first sensor element and the second sensor element; and adjusting a mistuned frequency of at least one sensor element out of the first sensor element and the second sensor element, and in the adjusting of the mistuned frequency, the adjustment is performed to satisfy the relationship fm1<fm2, when a mistuned frequency of the first sensor element is set to fm1 and a mistuned frequency of the second sensor element is set to fm2.

With this configuration, it is possible to manufacture a sensor device capable of detecting angular velocities around a plurality of detection axes in the directions which intersect with each other while reducing the difference between the noise levels of the sensor outputs of a plurality of sensor elements which are driven at the drive frequencies different from each other.

APPLICATION EXAMPLE 13

This application example is directed to an electronic apparatus including the sensor device according to the application example.

With this configuration, it is possible to provide a highly reliable electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a sensor device, a manufacturing method of a sensor device and an electronic apparatus of the invention will be described based on embodiments shown in appended drawings.

Figure 1:
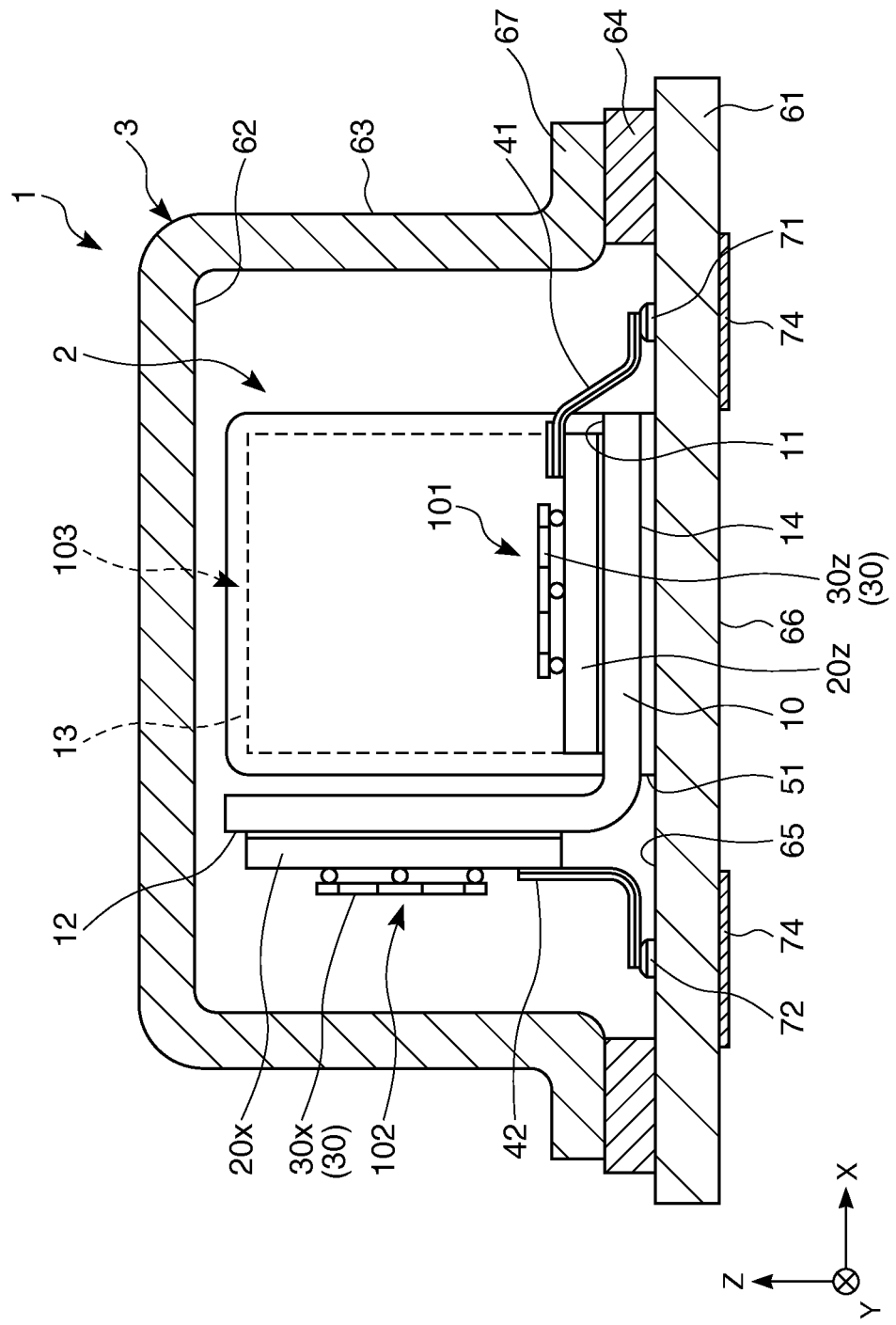
FIG. 1 is a schematic cross-sectional view of a sensor device relating to an embodiment of the invention.
Figure 2:
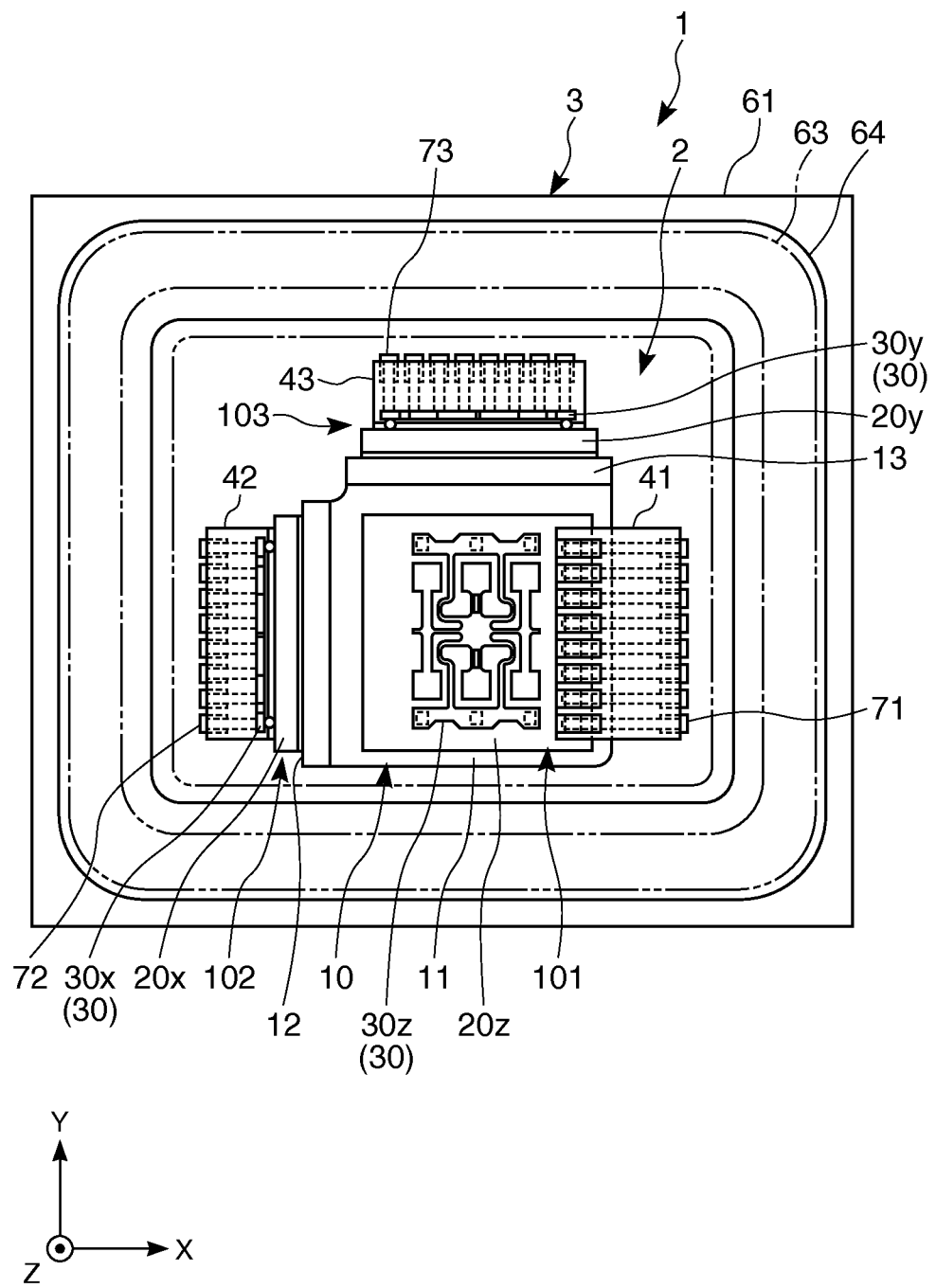
FIG. 2 is a plan view of the sensor device shown in FIG. 1.
Figure 3:
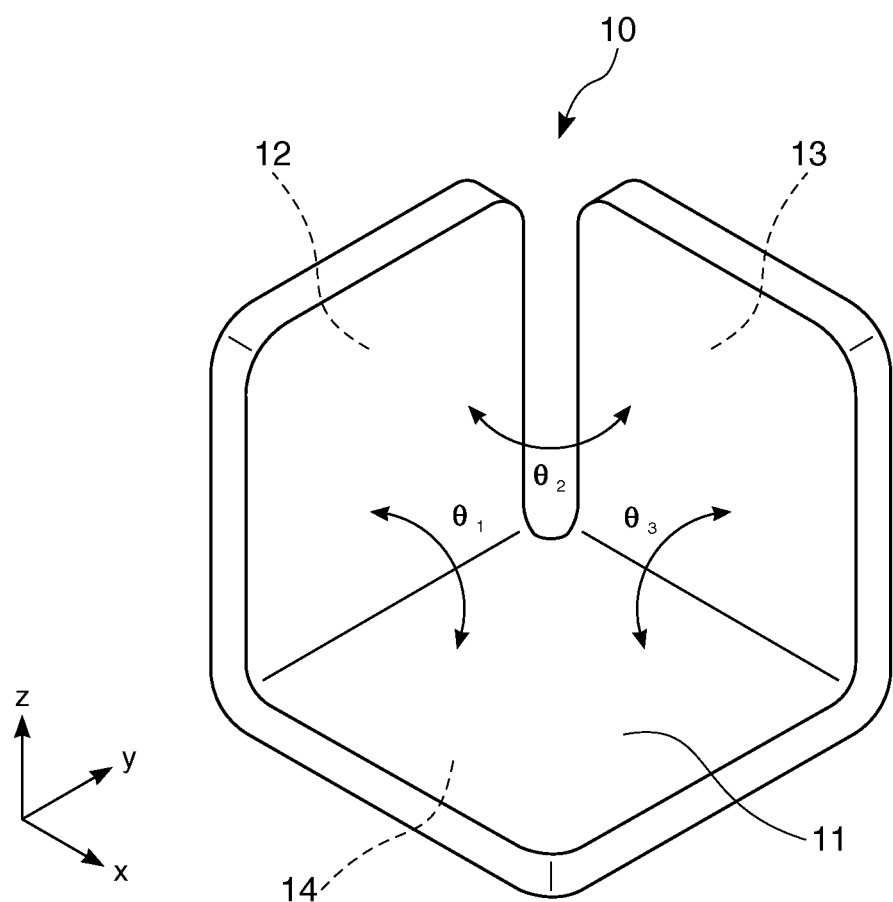
FIG. 3 is a perspective view of a supporting member included in the sensor device shown in FIG. 1.
Figure 4:
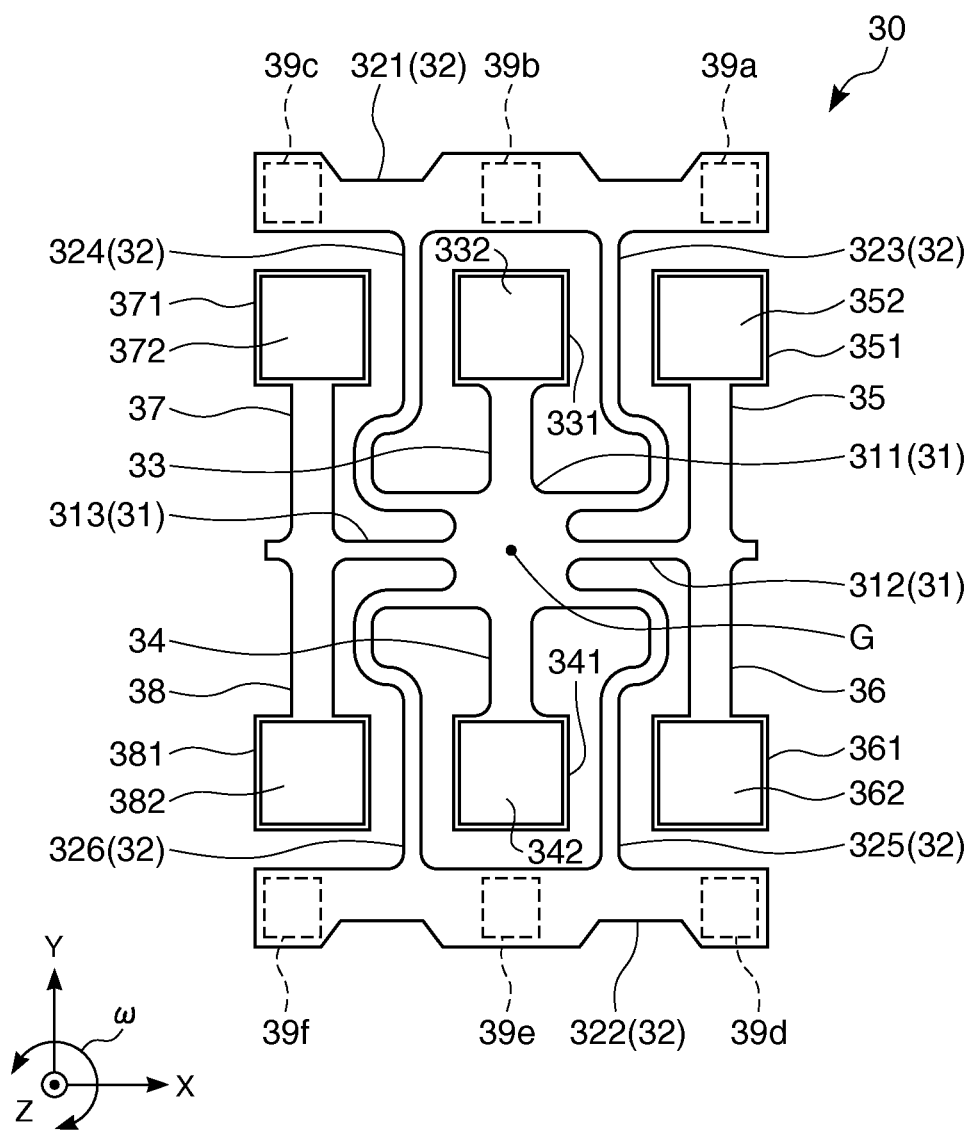
FIG. 4 is a plan view of a sensor element included in the sensor device shown in FIG. 1.
Figure 5:
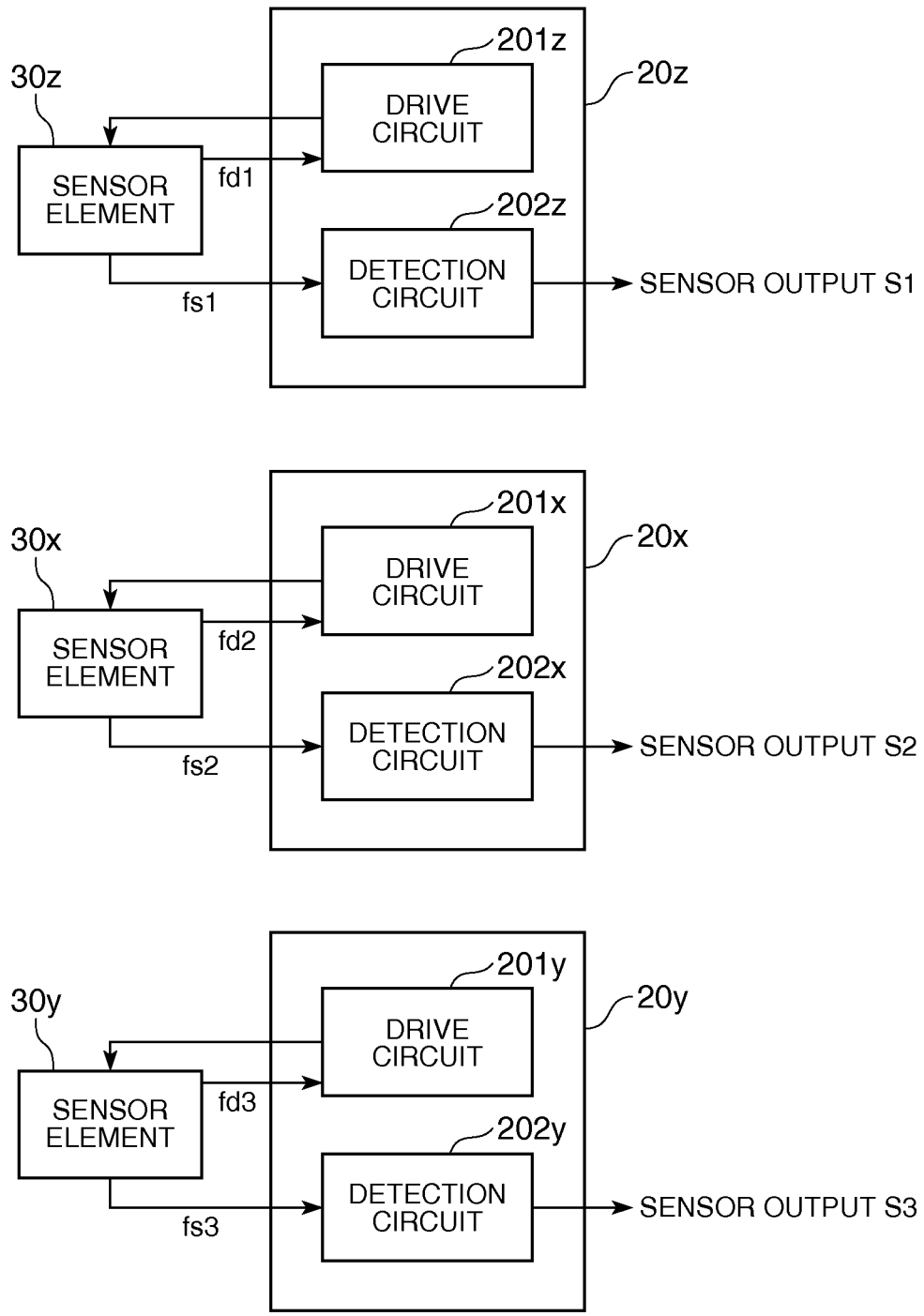
FIG. 5 is a block diagram illustrating a control system of the sensor device shown in FIG. 1.
Figure 6:
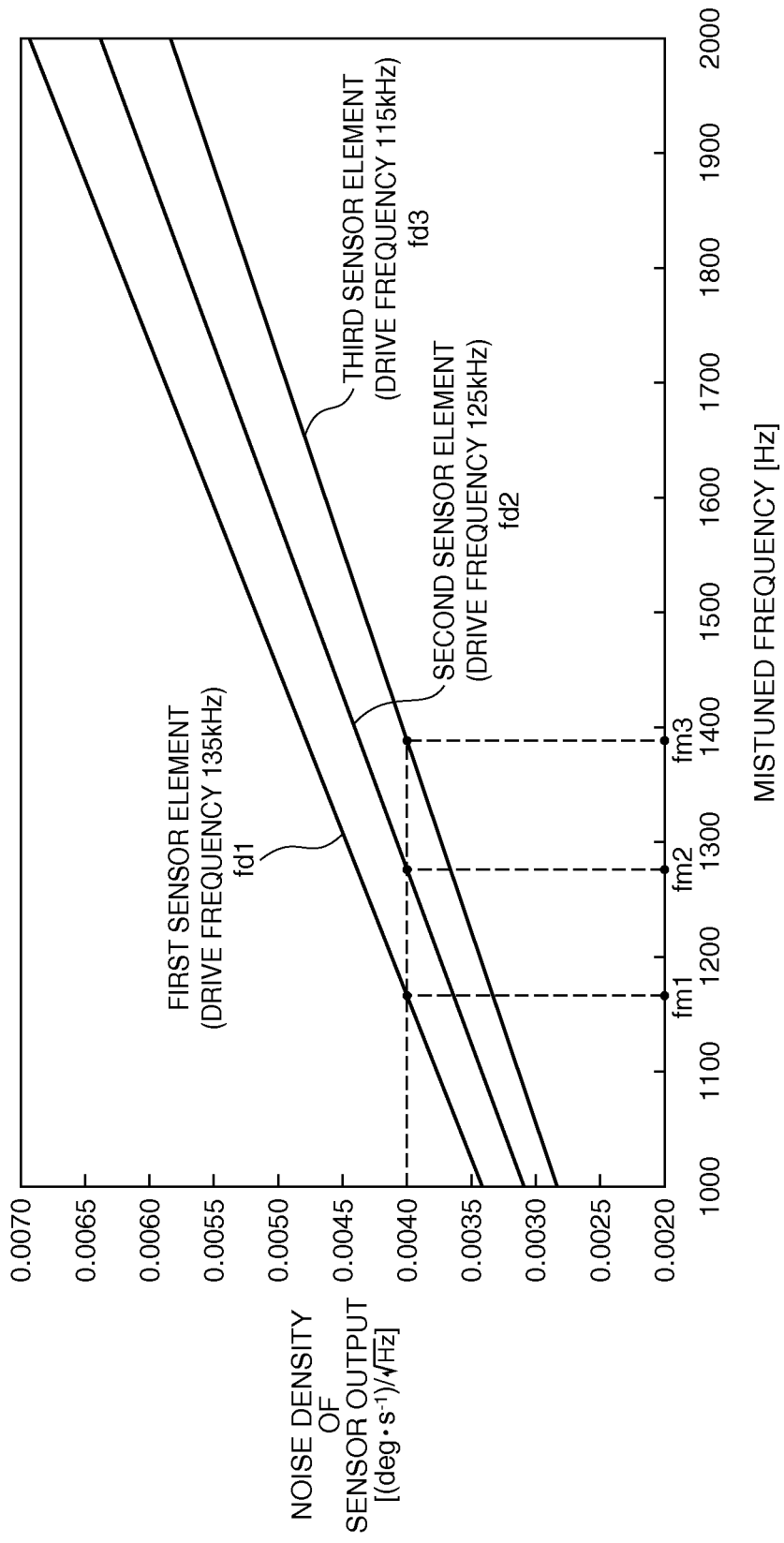
FIG. 6 is a graph illustrating a relationship between mistuned frequencies and the noise density of the sensor outputs of a plurality of sensor elements included in the sensor device shown in FIG. 1.
Figure 7A:
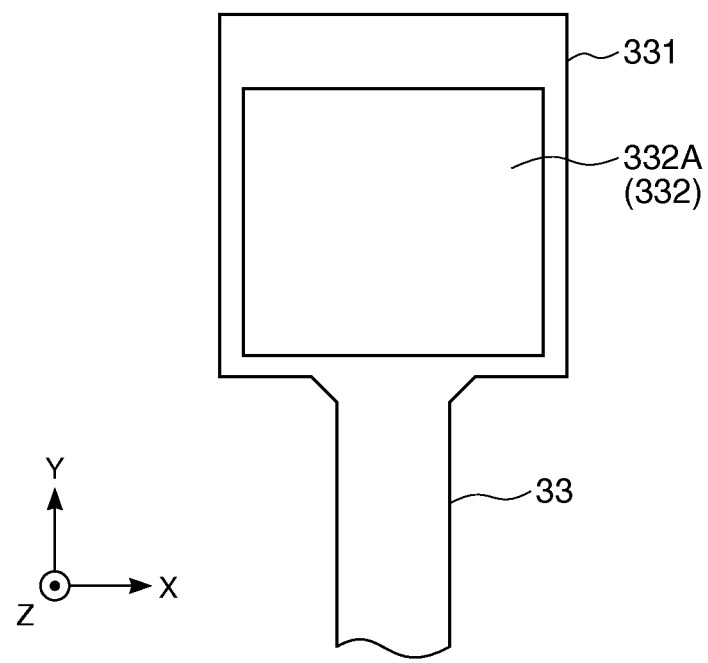
FIGS. 7A and 7B are views illustrating the adjustment of a mistuned frequency in a manufacturing method of a sensor device shown in FIG. 1.
Figure 7B:
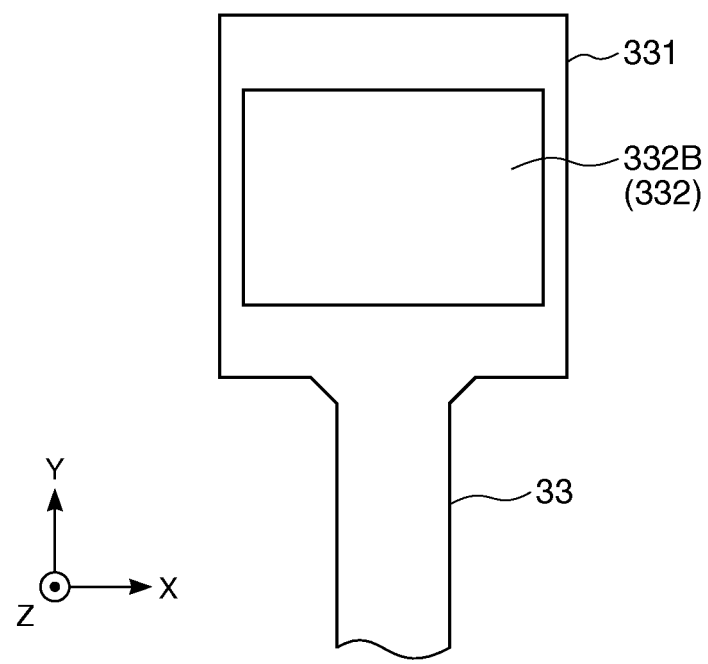

FIG. 1 is a schematic cross-sectional view illustrating a schematic configuration of a sensor device relating to an embodiment of the invention, FIG. 2 is a plan view of the sensor device shown in FIG. 1, FIG. 3 is a perspective view illustrating a supporting member included in the sensor device shown in FIG. 1, FIG. 4 is a plan view of a sensor element included in the sensor device shown in FIG. 1, FIG. 5 is a block diagram illustrating a control system of the sensor device shown in FIG. 1, FIG. 6 is a graph illustrating a relationship between mistuned frequencies of a plurality of sensor elements and the noise density of the sensor outputs included in the sensor device shown in FIG. 1, and FIGS. 7A and 7B are views illustrating the adjustment of a mistuned frequency in a manufacturing method of a sensor device shown in FIG. 1.

Further, hereinafter, for convenience of explanation, in FIGS. 1 to 3, x axis, y axis and z axis are shown as three axes orthogonal to each other, and the leading end sides of the arrows illustrated are set to "+side", the proximal end sides of the arrows are set to "−side." Further, the direction parallel to the x axis is referred to as "the x axis direction", the direction parallel to the y axis is referred to as "the y axis direction", and the direction (vertical direction) parallel to the z axis is referred to as "the z axis direction", in addition, +z side (the upper side in FIG. 1) is referred to as "up", and −z side (the lower side in FIG. 1) is referred to as "down.". Furthermore, X axis (electrical axis), Y axis (mechanical axis) and Z axis (optical axis) of crystal are shown in FIG. 4.

Sensor Device

The sensor device 1 shown in FIG. 1 is a gyro sensor which detects the respective angular velocities around three axes (three detection axes) of the x axis, the y axis and the z axis that are orthogonal to each other.

The sensor device 1 is used, for example, in a camera shake correction of an imaging device, and an attitude detection, an attitude control, and the like of a vehicle in a mobile navigation system using a GPS (Global Positioning System) satellite signal.

As shown in FIG. 1, the sensor device 1 has a sensor module 2 and a package 3 that houses the sensor module 2.

Hereinafter, each of portions constituting the sensor device 1 will be sequentially described.

Sensor Module

As shown in FIGS. 1 and 2, the sensor module 2 includes a supporting member 10, a sensor unit 101 which detects the angular velocity around the z axis (first detection axis), and a sensor unit 102 which detects the angular velocity around the x axis (second detection axis) and a sensor unit 103 which detects the angular velocity around the y axis (third detection axis).

Then, the sensor unit 101 includes an IC chip 20z, a sensor element 30z, and a flexible wiring substrate 41. Further, the sensor unit 102 includes an IC chip 20x, a sensor element 30x, and a flexible wiring substrate 42. Furthermore, the sensor unit 103 includes an IC chip 20y, a sensor element 30y, and a flexible wiring substrate 43.

Here, the sensor elements 30z, 30x and 30y (Hereinafter, briefly referred to as "sensor element 30") have the same configuration with each other except that the drive frequencies, the detection frequencies and the mistuned frequencies thereof are different with each other. Further, the IC chips 20z, 20x and 20y (Hereinafter, briefly referred to as "IC chip 20") have the same configuration with each other except that the IC chips 20z, 20x and 20y have respectively different sensor elements 30z, 30x and 30y.

In this way, the sensor module 2 includes the supporting member 10, three IC chips 20, three sensor elements 30, and three flexible wiring substrates 41, 42 and 43.

Supporting Member

The supporting member 10 has a function for supporting three sensor units 101, 102 and 103.

As shown in FIG. 3, the supporting member 10 has a first supporting surface 11 orthogonal to the z axis, a second supporting surface 12 orthogonal to the x axis and a third supporting surface 13 orthogonal to the y axis.

Here, an angle θ1 formed by the first supporting surface 11 and the second supporting surface 12, an angle θ2 formed by the second supporting surface 12 and the third supporting surface 13, and an angle θ3 formed by the first supporting surface 11 and the third supporting surface 13 are respectively 90 degrees (right angle). In addition, each of angles θ1 to θ3 may not be strictly 90 degrees, and some errors (approximately 0 degrees to 2 degrees) are allowed within the range that does not affect the sensing function of the sensor module 2.

As components of the supporting member 10, without being especially limited, but for example, metal such as structural steel, stainless steel, copper, brass, phosphor bronze and German silver can be preferably used.

Further, in a case where the supporting member 10 is made of the aforementioned metal, the supporting member 10 can be formed by bending the metal plate made of the above metal. In addition, the shape of the supporting member 10 is not limited to the shape shown in FIG. 3, but for example, may be formed in the shape of a block body such as a cuboid, a polygonal columnar shape, a polygonal pyramid shape, and the like.

IC Chip

The IC chip 20 shown in FIG. 1 and FIG. 2 has a function for driving the sensor element 30 and a function for detecting the signal from the sensor element 30.

The IC chip 20 has a plat-like shape, the surface on one side thereof is an active surface and the surface on the other side thereof is an inactive surface.

Then, the inactive surface of the IC chip 20 of the sensor unit 101 is adhered to the first supporting surface 11 of the aforementioned supporting member 10 by an adhesive agent (not shown) having an insulation property. In the same way, the inactive surface of the IC chip 20 of the sensor unit 102 is adhered to the second supporting surface 12 of the supporting member 10 by an adhesive agent (not shown) having the insulation property. Further, the inactive surface of the IC chip 20 of the sensor unit 103 is adhered to the third supporting surface 13 of the supporting member 10 by an adhesive agent (not shown) having the insulation property.

On the other hand, an integrated circuit is formed on the active surface of the IC chip 20.

Specifically, as shown in FIG. 5, the IC chip 20z has a drive circuit 201z which outputs a drive signal for driving the sensor element 30z, and a detection circuit 202z which detects the detection signal from the sensor element 30z.

In the same way, the IC chip 20x has a drive circuit 201x which outputs a drive signal for driving the sensor element 30x, and a detection circuit 202x which detects the detection signal from the sensor element 30x.

Further, the IC chip 20y has a drive circuit 201y which outputs a drive signal for driving the sensor element 30y, and a detection circuit 202y which detects the detection signal from the sensor element 30y.

The drive circuit 201z outputs the drive signal such that the sensor element 30z is driven at the drive frequency fd1. In the same way, the drive circuit 201x outputs the drive signal such that the sensor element 30x is driven at the drive frequency fd2. Further, the drive circuit 201y outputs the drive signal such that the sensor element 30y is driven at the drive frequency fd3.

Here, the drive signals that are output from the drive circuits 201z, 201x and 201y may be the same or different with each other. In a case where the drive signals that are output from the drive circuits 201*z*, 201*x* and 201*y* are the same with each other, by using the drive signal that is matched to the intermediate drive frequency out of three drive frequencies, it is possible to drive the sensor elements 30*z*, 30*x* and 30*y* in each resonance frequency. Further, in a case where the drive signals that are output from the drive circuits 201*z*, 201*x* and 201*y* are different with each other, it is possible to use the drive signal that is matched to each of resonance frequencies of the sensor elements 30*z*, 30*x* and 30*y*.

Further, the detection circuits 202*z*, 202*x* and 202*y* amplify the detection signals as necessary and output the amplified signals as the sensor outputs S1, S2 and S3. For example, the detection circuits 202*z*, 202*x* and 202*y* amplify the detection signals such that the signal amounts of the sensor output S1, S2 and S3 become equal with each other.

Further, a connection terminal and an external connection terminal that are electrically connected to the aforementioned integrated circuit, not shown, are provided on the active surface side of the IC chip 20.

The connection terminal of the IC chip 20 is a protruding electrode formed in a bump shape, for example, using a solder ball, a gold wire, an aluminum wire, and the like. Then, the connection terminal is electrically and mechanically connected to the sensor element 30. Accordingly, the integrated circuit of the IC chip 20 is electrically connected to the sensor element 30.

Further, the connection terminal has a function for fixing and supporting the sensor element 30 with respect to the IC chip 20. Here, since the connection terminal is the protruding electrode, the connection terminal functions as a spacer for forming a gap between the sensor element 30 and the IC chip 20. Thus, it is possible to ensure a space where the drive vibration and the detection vibration of the sensor element 30 are allowed.

Further, the external connection terminal of the IC chip 20 is a protruding electrode formed in a bump shape, for example, using a solder ball, a gold wire, an aluminum wire, and the like. Then, the external connection terminal is electrically and respectively connected to the flexible wiring substrate 41 in the sensor unit 101, the flexible wiring substrate 42 in the sensor unit 102 and the flexible wiring substrate 43 in the sensor unit 103. Accordingly, the integrated circuit of the IC chip 20 of each of the sensor units 101, 102 and 103 is electrically connected to each of the flexible wiring substrates 41, 42 and 43.

Sensor Element

The sensor element 30 (sensor element piece) is a gyro sensor element which detects the angular velocity around one axis. Specifically, the sensor element 30*z* (first sensor element) detects the angular velocity around the z axis (first detection axis), the sensor element 30*x*(second sensor element) detects the angular velocity around the x axis (second detection axis) and the sensor element 30*y* (third sensor element) detects the angular velocity around the y axis (third detection axis).

Since the detection axes of the sensor elements 30*z*, 30*x* and 30*y* are orthogonal to each other, the processing of the detection signals becomes simple. Therefore, with a simple configuration, it is possible to very accurately detect the angular velocities around three detection axes orthogonal to each other.

The sensor element 30 is made of crystal of which the main part (base material) is piezoelectric material.

The crystal has the X axis (electrical axis), the Y axis (mechanical axis) and the Z axis (optical axis) orthogonal to each other. The sensor element 30 is formed in the plate shape which has the plate surface parallel to the X axis and the Y axis of the crystal. Further, in the sensor element 30, Z axis of the crystal is present along the thickness direction thereof. The thickness of the sensor element 30 is appropriately set depending on the oscillation frequency (resonance frequency), an outline size, processability, and the like.

Here, the sensor element 30*z* is disposed such that the Z axis of the crystal is parallel to the z axis. Further, the sensor element 30*x* is disposed such that the Z axis of the crystal is parallel to the x axis. Further, the sensor element 30*y* is disposed such that the Z axis of the crystal is parallel to the y axis.

Further, the directions of the X axis, the y axis and the Z axis of the crystal in the sensor element 30 are allowed within the range (0 degrees to 7 degrees) in which a small amount of error is allowed at the time of being cutout from the crystal.

Further, the sensor element 30 is formed by an etching (wet etching or dry etching) using a photolithography technology.

As shown in FIG. 4, the sensor element 30 has a structure which is so-called a double T type.

More specifically, the sensor element 30 has a base portion 31, a supporting section 32 for supporting the base portion 31, two detection vibrating arms 33 and 34 extended from the base portion 31, and four drive vibrating arms 35 to 38.

The base portion 31 includes a main body portion 311, and a pair of connecting arms 312 and 313 extended to the sides opposite to each other along the x axis direction from the main body portion 311.

The supporting portion 32 includes a pair of fixing portions 321 and 322 fixed to the IC chip 20, a pair of bridge portions 323 and 324 for connecting the fixing portion 321 and the main body portion 311 of the base portion 31 and a pair of bridge portions 325 and 326 for connecting the fixing portion 322 and the main body portion 311 of the base portion 31.

The detection vibrating arms 33 and 34 are extended to the sides opposite to each other along the y axis direction from the main body portion 311 of the base portion 31.

The drive vibrating arms 35 and 36 are extended to the sides opposite to each other along the y axis direction from the leading end of the connecting arm 312 of the base portion 31.

The drive vibrating arms 37 and 38 are extended to the directions opposite to each other along the y axis direction from the leading end of the connecting arm 313 of the base portion 31.

In the embodiments, a weight section (hammerhead) 331 greater in the width than the proximal end is provided in the leading end of the detection vibrating arm 33. In the same way, a weight section 341 is provided in the leading end of the detection vibrating arm 34, a weight section 351 is provided in the leading end of the drive vibrating arm 35, a weight section 361 is provided in the leading end of the drive vibrating arm 36, a weight section 371 is provided in the leading end of the drive vibrating arm 37, and a weight section 381 is provided in the leading end of the drive vibrating arm 38. These weight sections are provided, whereby it is possible to adjust the frequency of the sensor element 30.

Further, a mass adjusting film 332 is provided in the leading end (weight section 331) of the detection vibrating arm 33. In the same way, a mass adjusting film 342 is provided in the leading end (weight section 341) of the detection vibrating arm 34. Further, a mass adjusting film 352 is provided in the leading end (weight section 351) of the drive vibrating arm 35. Further, a mass adjusting film 362 is provided in the leading end (weight section 361) of the drive vibrating arm 36. Further, a mass adjusting film 372 is provided in the leading end (weight section 371) of the drive vibrating arm 37. Further, a mass adjusting film 382 is provided in the leading end (weight section 381) of the drive vibrating arm 38.

In the sensor element 30 having these mass adjusting films 332, 342, 352, 362, 372 and 382, it is possible to easily adjust the drive frequency, the detection frequency and the mistuned frequency, by removing at least a part of the mass adjusting films 332, 342, 352, 362, 372 and 382.

Further, in the sensor element 30 having the detection vibrating arms 33 and 34 and the drive vibrating arms 35 to 38, it is possible to individually adjust the drive frequency and the detection frequency in the frequency adjustment described later. Therefore, it is possible to easily adjust the mistuned frequency.

As constituent material of the mass adjusting films 332, 342, 352, 362, 372 and 382, without being specially limited, it is possible to use for example, metals, inorganic compounds, resin and the like, but it is preferable to use metals or metal compounds.

Metals or inorganic compounds can be easily and accurately deposited by a vapor deposition method.

Further, it is possible to remove simply and accurately the mass adjusting film (weight film) made of metals or inorganic compounds by irradiation of energy beam (in particular, laser). Thus, the mass adjusting film is deposited by metals and inorganic compounds, whereby frequency adjustment described later becomes more simple and accurate.

The metal material includes, for example, gold (Au), gold alloy, platinum (Pt), aluminum (Al), aluminum alloy, silver (Ag), silver alloy, chromium (Cr), chrome alloy, copper (Cu), molybdenum (Mo), niobium (Nb), tungsten (W), iron (Fe), titanium (Ti), cobalt (Co), zinc (Zn), zirconium (Zr), and the like. One or a combination of two or more out of the above materials can be used. From a view point that an excitation electrode and a detection electrode can be integrally formed, it is preferable to use Al, Cr, Fe, Ni, Cu, Ag, Au and Pt or alloy including at least one out of the previously mentioned materials as the metal material.

In addition, such an inorganic compound includes oxide ceramics such as alumina (aluminum oxide), silica (silicon oxide), titania (titanium oxide), zirconia, yttria and calcium phosphate, nitride ceramics such as silicon nitride, aluminum nitride, titanium nitride and boron nitride, carbide-based ceramics such as graphite and tungsten carbide, and ferroelectric material such as barium titanate, strontium titanate, PZT, PLZT, PLLZT, etc. It is preferable to use insulating materials such as silicon oxide ($SiO_2$), titanium oxide ($TiO_2$), aluminum oxide ($Al_2O_3$) among the above materials as the ceramics.

Further, it is preferable that the thickness (average thickness) of the mass adjusting films 332, 342, 352, 362, 372, 382, without being specially limited, is approximately 1 nm to 1000 nm. Accordingly, it is possible to easily achieve the mass adjusting films 332, 342, 352, 362, 372 and 382 of which each thickness is accurately defined.

Then, the sensor element 30 includes the detection electrodes (not shown) provided in each of the detection vibrating arms 33 and 34, the excitation electrodes (not shown) provided in each of the drive vibrating arms 35 to 38, a plurality of terminals 39a to 39f provided in the fixing portions 321, 322 of the supporting portion 32. The terminals 39a and 39d are electrically connected to the excitation electrodes of the drive vibrating arms 35 to 38, the terminals 39b and 39c are electrically connected to the detection electrode of the detection vibrating arms 33, and the terminals 39e and 39f are electrically connected to the detection electrode of the detection vibrating arms 34.

The sensor element 30 is mounted on the active surface of the IC chip 20 so as to overlap with the aforementioned IC chip 20 in the plan view.

Here, the terminals 39a to 39f are electrically and mechanically connected to each connection terminal of the IC chip 20, whereby the sensor element 30 is mounted on the IC chip 20.

Further, the sensor element 30 is provided such that the plate surface thereof is along (substantially parallel to) the plate surface of the IC chip 20. Accordingly, in the sensor unit 101, the plate surface of the sensor element 30z is orthogonal to the z axis. Further, in the sensor unit 102, the plate surface of the sensor element 30x is orthogonal to the x axis. Further, in the sensor unit 103, the plate surface of the sensor element 30y is orthogonal to the y axis.

In the sensor element 30 configured like above, the drive signal is applied to the excitation electrode from the drive circuit of the IC chip 20 through the terminals 39a and 39d, whereby the drive vibrating arm 35 and the drive vibrating arm 37 perform the flexural vibration (drive vibration) in order to move toward or away from each other, and the drive vibrating arm 36 and the drive vibrating arm 38 perform the flexural vibration (drive vibration) in order to move toward or away from each other in the same direction as the flexural vibration.

In a state where the drive vibrating arms 35 to 38 are caused to drive and vibrate, if the angular velocity W around the normal line passing through the center of gravity G is applied to the sensor element 30, Coriolis force acts on the drive vibrating arms 35 to 38. Thus, the connecting arms 312 and 313 are caused to flexurally vibrate and the main body portion 311 is rotated and vibrated around the normal line (detection axis) passing through the center of gravity G, and thus the flexural vibration (detection vibration) of the detection vibrating arms 33 and 34 is excited.

The charges (detection signals) which are generated in the detection electrode by the detection vibration of the detection vibrating arms 33 and 34 are detected in the detection circuit of the IC chip 20 through the terminals 39b, 39c, 39e and 39f. Thus, it is possible to obtain the angular velocity W added in the sensor element 30.

To be specific, the sensor element 30z of the sensor unit 101 can detect the angular velocity around the z axis because the plate surface thereof is orthogonal to the z axis. Further, the sensor element 30x of the sensor unit 102 can detect the angular velocity around the x axis because the plate surface thereof is orthogonal to the x axis. Further, the sensor element 30y of the sensor unit 103 can detect the angular velocity around the y axis because the plate surface thereof is orthogonal to the y axis.

In the sensor elements 30z, 30x and 30y, when the drive frequency of the sensor element 30z is set to fd1, the drive frequency of the sensor element 30x is set to fd2, and the drive frequency of the sensor element 30y is set to fd3, the relationship fd1>fd2>fd3 is satisfied.

Therefore, it is possible to reduce the crosstalk of the drive signals or the detection signals among the sensor elements 30z, 30x and 30y, and thus to improve the detection accuracy.

Then, under the above relationship among the drive frequencies, when the mistuned frequency of the sensor element 30z is set to fm1, the mistuned frequency of the sensor element 30x is set to fm2, and the mistuned frequency of the sensor element 30y is set to fm3, the relationship fm1<fm2<fm3 is satisfied. In addition, the mistuned frequency refers to the absolute value of the difference between the drive frequency and the detection frequency.

Since the above relationship of the mistuned frequencies is satisfied, it is possible to detect the angular velocities around three detection axes intersecting with each other while reducing the difference between noise levels of the sensor outputs between three sensor elements 30z, 30x and 30y that are driven at the drive frequencies different with each other.

To be specific, as shown in FIG. 6, in the sensor elements having different drive frequencies, when the mistuned frequencies are equal with each other, the higher the drive frequency, the larger the noise density of the sensor output. That is, in the sensor elements having different drive frequencies, when the mistuned frequencies are equal with each other, the higher the drive frequency, the worse the sensitivity (S/N ratio) of the sensor element. This is because the higher the drive frequency becomes, the lower Q value becomes. Further, the higher the mistuned frequency becomes, the higher the noise density of the sensor output becomes.

From the above fact, the aforementioned relationship between the drive frequency and the mistuned frequency is satisfied, whereby it is possible to reduce the difference between the noise levels of the sensor outputs of the sensor elements 30z, 30x and 30y, that is, the difference between the noise densities (noise levels) of the sensor outputs S1, S2 and S3.

Further, the difference between the noise density of the sensor output S1 of the sensor element 30z (first sensor element) and the noise density of the sensor output S2 of the sensor element 30x (second sensor element) is preferably 0 [deg·s−1/√Hz] or more and 0.0003 [deg·s−1/√Hz] or less, and more preferably 0 [deg·s−1/√Hz] or more and 0.0001 [deg·s−1/√Hz] or less. Thus, it is possible to make the noise densities of the sensor outputs of the sensor element 30z and the sensor element 30x substantially equal.

From the similar view point, the difference between the noise density of the sensor output S2 of the sensor element 30x (second sensor element) and the noise density of the sensor output S3 of the sensor element 30y (third sensor element) is preferably 0 [deg·s−1/√Hz] or more and 0.0003 [deg·s−1/√Hz] or less, and more preferably 0 [deg·s−1/√Hz] or more and 0.0001 [deg·s−1/√Hz] or less.

Further, the difference between the drive frequency fd1 of the sensor element 30z and the drive frequency fd2 of the sensor element 30x is preferably 3 kHz or more, more preferably 3 kHz or more and 30 kHz or less, and still more preferably 5 kHz or more and 15 kHz or less. Thus, it is possible to effectively reduce the crosstalk of the drive signals or the detection signals between the sensor element 30z and the sensor element 30x.

From the similar view point, the difference between the drive frequency fd2 of the sensor element 30x and the drive frequency fd3 of the sensor element 30y is preferably 3 kHz or more, more preferably 3 kHz or more and 30 kHz or less, and still more preferably 5 kHz or more and 15 kHz or less.

Further, when the detection frequency of the sensor element 30z is set to fs1, and the detection frequency of the sensor element 30x is set to fs2, it is preferable that the relationship fd1<fs1 and fd2<fs2, or fd1>fs1 and fd2>fs2 is satisfied. Thus, it is possible to easily design the sensor element 30z and the sensor element 30x.

From the similar view point, when the detection frequency of the sensor element 30y is set to fs3, in a case where the relationship fd1<fs1 and fd2<fs2 is satisfied, it is preferable to satisfy the relationship fd3<fs3, and in a case where the relationship fd1>fs1 and fd2>fs2 is satisfied, it is preferable to satisfy the relationship fd3 >fs3.

In addition, the specific numerical value of each of the drive frequencies fd1, fd2 and fd3 and the mistuned frequencies fm1, fm2 and fm3 is appropriately determined depending on the size, the shape and material of the sensor element 30, the use of the sensor device 1, and the like. If the aforementioned relationship is satisfied, the sensor element 30 is not limited to the configuration shown in FIG. 4.

Flexible Wiring Substrate

The flexible wiring substrates 41, 42 and 43 shown in FIGS. 1 and 2 each includes a base layer (not shown) that is mainly composed of a resin having flexibility such as a polyimide and a wiring pattern layer (not shown) bonded to the base layer.

Then, in the flexible wiring substrate 41, one end portion of the wiring pattern layer is attached (bonded) to the external connection terminal (not shown) of the IC chip 20z which is supported on the first supporting surface 11 and the other end portion of the wiring pattern layer is electrically connected to the internal terminal 71 of the package 3 described later. In the same way, in the flexible wiring substrate 42, one end portion of the wiring pattern layer is attached (bonded) to the external connection terminal (not shown) of the IC chip 20x which is supported on the second supporting surface 12 and the other end portion of the wiring pattern layer is electrically connected to the internal terminal 72 of the package 3 described later. Further, in the flexible wiring substrate 43, one end portion of the wiring pattern layer is attached (bonded) to the external connection terminal (not shown) of the IC chip 20y which is supported on the third supporting surface 13 and the other end portion of the wiring pattern layer is electrically connected to the internal terminal 73 of the package 3 described later.

According to the sensor module 2 configured like the above description, it is possible to detect the angular velocity around each of the x axis, the y axis and the z axis.

The sensor module 2 is housed in the package 3, whereby it is possible to provide a sensor device 1 capable of detecting the angular velocity around each of the x axis, the y axis and the z axis.

Further, in comparison with a combination of three sensor devices which each detect the angular velocity around one axis (that is, a combination in which three sensor devices are separately incorporated), since the mounting space in the sensor module 2 is considerably reduced, it is possible to reduce the size of the device in which the sensor device 1 is incorporated, or to increase the degree of freedom in the arrangement, the design, or the like when being incorporated in the device.

Further, in comparison with a combination of three sensor devices which each detect the angular velocity around one axis, the sensor module 2 can also be reduced in cost because the number of package is small.

Further, in comparison with a combination of three sensor devices which each detect the angular velocity around one axis, the sensor module 2 can be placed in the originally stable mounting orientation, thereby being improved in the impact resistance.

Further, in the sensor module 2, since the orthogonality of the detection axes of three sensor elements 30 is determined by the processing accuracy of the support member 10 (accuracies of angles θ1, θ2 and θ3), the orthogonality of three detection axes is not dependent on the mounting accuracy (accuracy of the mounting angle of the package) in a device in which the sensor device 1 is incorporated, but the high accuracy in the detection can be simply achieved. On the other hand, in a combination of three sensor devices which each detect the angular velocity around one axis, since the orthogonality of three detection axes is dependent on the mounting accuracy of each sensor device, it is difficult to increase the detection accuracy.

Package

As shown in FIG. 1, the package 3 includes a plate shaped base member 61 and a lid member 63 (cap) having a concave portion 62.

In the embodiments, the base member 61 has a rectangular shape, in the plan view seen from the z axis direction (Hereinafter, briefly referred to as "in the plan view").

The base member 61 is made of, for example, aluminum oxide sintered body, crystal, glass and the like.

As shown in FIG. 1, the rear surface 14 on the opposite side of the first supporting surface 11 of the aforementioned supporting member 10 is bonded by the bonding member 51 like an adhesive agent to the upper surface 65 (the surface on the side that is covered with the lid member 63) of the base member 61. Thus, the sensor module 2 is supported and fixed with respect to the base member 61.

Further, internal terminals 71, 72 and 73 are provided in the upper surface 65 of the base member 61. Flexible wiring substrates 41, 42 and 43 of the sensor module 2 are electrically connected to the internal terminals 71, 72 and 73, through a bonding member (not shown) having a conductive property, such as a conductive adhesive agent, an anisotropic conductive film, a solder, and the like.

On the other hand, a plurality of external terminals 74 are provided in the lower surface 66 (lower surface of package 3 and a surface along the upper surface 65) of the base member 61, and the external terminals 74 is used when the sensor device 1 is housed in the device (external device) to which the sensor device 1 is incorporated.

The plurality of external terminals 74 are electrically connected to the aforementioned internal terminals 71, 72 and 73, through an internal wiring, not shown. Thus, each of the sensor units 101, 102 and 103 of the sensor module 2 and the plurality of external terminals 74 are electrically connected.

These internal terminals 71, 72 and 73 and each of the external terminals 74 are respectively made of a metal film in which a coating such as nickel (Ni) and gold (Au) is laminated to a metallization layer such as tungsten (W) by plating.

A lid member 63 is provided in the upper surface 65 of the base member 61 to which the sensor module 2 is attached so as to cover the sensor module 2.

The lid member 63 has a concave portion 62 opening toward the base member 61 side. Thus, an internal space in which the sensor module 2 is housed is formed between the base member 61 and the concave portion 62.

A flange 67 is formed in the outer peripheral portion of the opening of the concave portion 62 of the lid member 63.

The flange 67 has a ring shape in the plan view.

The lid member 63 is made of, for example, the same material as the base member 61, or, metal such as kovar, 42 alloy and stainless steel.

The flange 67 of the lid member 63 is hermetically bonded to the upper surface 65 of the base member 61. Thus, the inside of the package 3 is hermetically sealed.

In the embodiments, the flange 67 and the base member 61 are bonded through the bonding member 64 made of metal. Specifically, for example, the bonding member 64 is bonded by a soldering with respect to the upper surface 65 of the base member 61, and is bonded by a seam welding, an energy beam welding (laser welding, electron beam welding, and the like) with respect to the flange 67 of the lid member 63.

In addition, in a case where the base member 61 is made of a metal capable of being diffusion bonded to the flange 67 by the seam welding, the energy beam welding, or the like, it is possible to omit the bonding member 64.

In this case, the flange 67 of the lid member 63 is directly bonded to the upper surface 65 of the base member 61 by the seam welding, the energy beam welding, or the like.

The bonding member 64 forms a square ring shape along the flange 67 of the lid member 63.

Manufacturing Method of Sensor Device

Next, with respect to a manufacturing method of a sensor device of an embodiment of the invention, the manufacturing method of the aforementioned sensor device 1 will be described as an example.

The manufacturing method of sensor device 1 has [A] preparing the sensor elements 30z, 30x and 30y (before frequency adjustment), and [B] adjusting the mistuned frequency of at least one sensor element out of the sensor elements 30z, 30x and 30y.

Hereinafter, A and B will be sequentially described.

[A]

First, the sensor elements 30z, 30x and 30y before frequency adjustment (non-adjustment) are prepared.

In this case, if the frequency adjustment described later is available in the sensor elements 30z, 30x and 30y, the sensor elements 30z, 30x and 30y may be a state of being incorporated into the sensor module 2, or may be housed in the package 3.

[B]

Next, the mistuned frequency of at least one sensor element out of the sensor elements 30z, 30x and 30y is adjusted.

Specifically, by removing at least a part of the mass adjusting films 332, 342, 352, 362, 372 and 382 by energy beam irradiation, at least one out of the drive frequency (resonance frequencies of drive vibrating arms 35 to 38) and the detection frequency (resonance frequencies of the detection vibrating arms 33 and 34) is changed, whereby the mistuned frequency is changed. In this case, the mistuned frequency is adjusted to satisfy the aforementioned relationship of the drive frequency and the mistuned frequency.

For example, as shown in FIG. 7A, the coarse adjustment of the resonance frequency (detection frequency) of the detection vibrating arm 33 is performed by removing a part on the leading end side of the mass adjusting film 332A of the detection vibrating arm 33. Next, as shown in FIG. 7B, the fine adjustment of the resonance frequency (detection frequency) of the detection vibrating arm 33 is performed by removing a part on the proximal end side of the mass adjusting film 332B after the coarse adjustment.

In addition, the shape, the site and the removal amount of the mass adjusting film 332 that is removed in the coarse adjustment and the fine adjustment are appropriately set as necessary, without being limited to the illustrated figures. For example, in a case of removing a part of mass adjusting film 332 by laser irradiation, the removed part has a line shape, a dot shape, and the like.

By the coarse adjustment and fine adjustment, the mass adjusting film 332 is reduced in the mass, and becomes the mass adjusting film 332B. As a result, in the detection vibrating arm 33, the resonance frequency, that is, the detection frequency is increased. Accordingly, it is possible to change the mistuned frequency. Specifically, in a case where the drive frequency is higher than the detection frequency, it is possible to decrease the mistuned frequency by raising the detection frequency. Further, in a case where the drive frequency is lower than the detection frequency, it is possible to increase the mistuned frequency by raising the detection frequency.

In the same way, it is possible to change the mistuned frequency by raising the drive frequency. Specifically, in a case where the drive frequency is higher than the detection frequency, it is possible to increase the mistuned frequency by raising the drive frequency. Further, in a case where the drive frequency is lower than the detection frequency, it is possible to decrease the mistuned frequency by raising the drive frequency.

Further, as long as the energy beam used for frequency adjustment can remove a necessary part of the mass adjusting film without adversely affecting the sensor element 30, the energy beam, without being specially limited, may include, for example, a radiation, an electron beam, laser, an ion beam, and the like, but a laser such as a carbon dioxide laser, an excimer laser, and a YAG laser can be preferably used. Accordingly, simply and surely, it is possible to remove apart or all of the mass adjusting film within a desirable amount.

The sensor device 1 can be achieved through the aforementioned A and B.

According to the manufacturing method of the sensor device 1, it is possible to provide the sensor device 1 capable of detecting an angular velocity around a plurality of detection axes of directions intersecting with each other while reducing the difference between the noise levels of the sensor outputs of a plurality of sensor elements 30$z$, 30$x$ and 30$y$ which are driven at the drive frequencies different with each other.

Hitherto, the sensor device of each embodiment described above can be incorporated and used in various electronic apparatuses.

These electronic apparatuses are excellent in reliability.

Electronic Apparatus

Here, an example of an electronic apparatus including the sensor device of the invention will be described in detail based on FIGS. 8 to 10.

Figure 8:
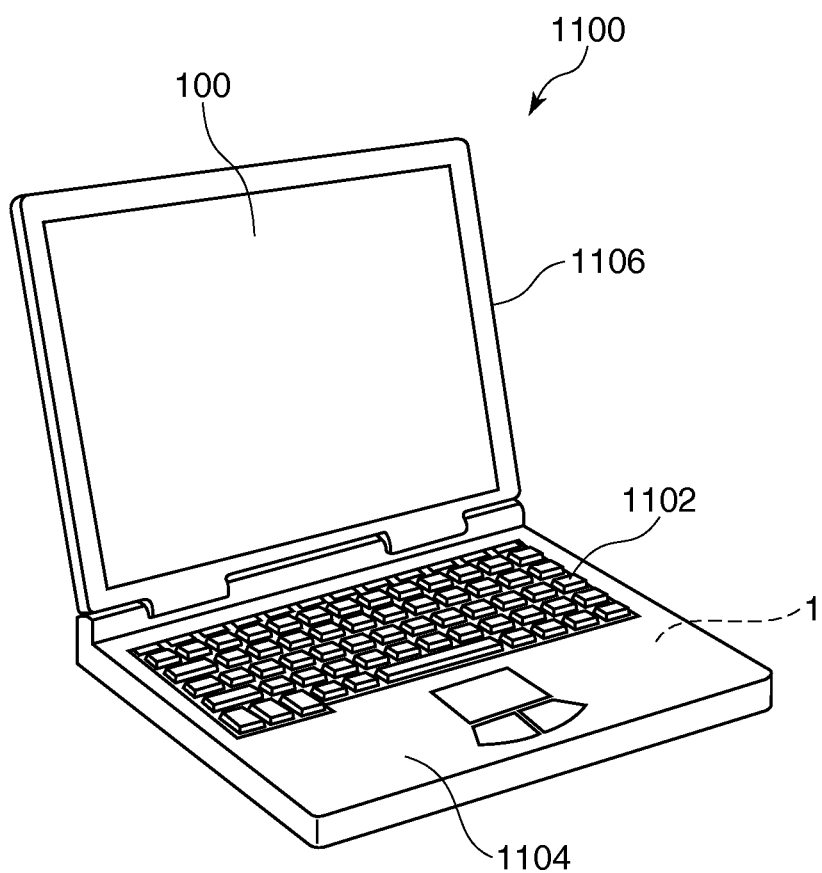
FIG. 8 is a perspective view illustrating a configuration of a personal computer of a mobile type (or a notebook type) to which the electronic apparatus of the embodiment of the invention is applied.

FIG. 8 is a perspective view illustrating a configuration of a mobile type (or a notebook type) personal computer to which the electronic apparatus of the invention is applied.

In this figure, the personal computer 1100 includes a main body portion 1104 having a keyboard 1102 and a display unit 1106 having a display section 100, and the display unit 1106 is rotatably supported to the main body portion 1104 via a hinge structure portion.

The aforementioned sensor device 1 which functions as a gyro sensor is built-in in the personal computer 1100.

Figure 9:
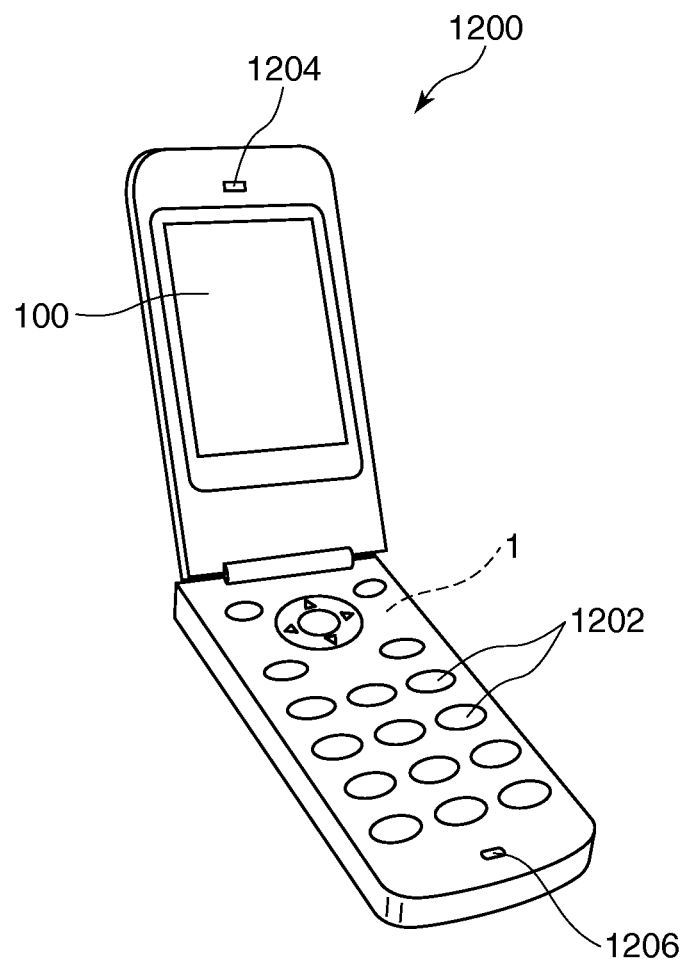
FIG. 9 is a perspective view illustrating a configuration of a mobile phone (including PHS) to which the electronic apparatus of the embodiment of the invention is applied.

FIG. 9 is a perspective view illustrating a configuration of a mobile phone (including a PHS and a smartphone) to which the electronic apparatus of the invention is applied.

In this figure, the mobile phone 1200 has a plurality of operation buttons 1202, an ear piece 1204 and a mouth piece 1206, and a display section 100 is disposed between the operation buttons 1202 and the ear piece 1204.

The aforementioned sensor device 1 which functions as a gyro sensor is built-in in the mobile phone 1200.

Figure 10:
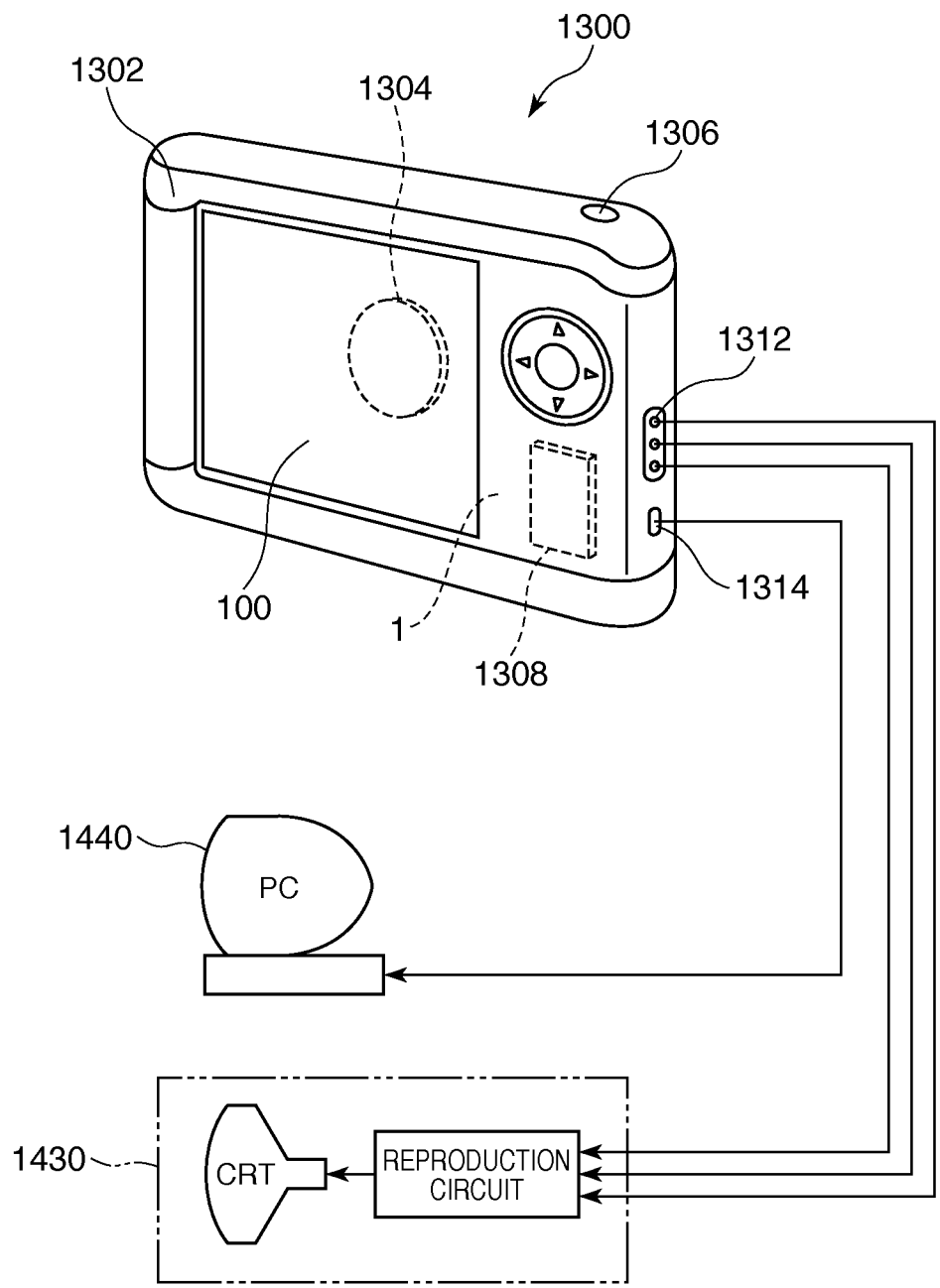
FIG. 10 is a perspective view illustrating a configuration of a digital still camera to which the electronic apparatus of the embodiment of the invention is applied.

FIG. 10 is a perspective view illustrating a configuration of a digital still camera to which the electronic apparatus of the invention is applied. In addition, in this figure, a connection between the camera and an external apparatus is briefly illustrated.

Here, the silver halide photographic film is exposed to form the optical image of an object in a normal camera, whereas the optical image of an object is photoelectric-converted by the imaging device such as a CCD (Charge Coupled Device) and an imaging signal (image signal) is generated in the digital still camera 1300.

In the digital still camera 1300, a display section is provided in the rear surface of the case (body) 1302 and performs display based on the imaging signal by CCD. The display section functions as a finder that displays the object as an electronic image.

Further, a light receiving unit 1304 including an optical lens (imaging optical system), a CCD, and the like is provided in the front surface side of the case 1302 (rear surface side in the figure).

The photographer confirms an object image displayed on the display section, and if the photographer presses a shutter button 1306, the imaging signal of the CCD at that moment is transmitted and stored in the memory 1308.

Further, in the digital still camera 1300, a video signal output terminal 1312 and an input and output terminal 1314 for data communication are provided in the side surface of the case 1302.

Then, as shown in the figure, a television monitor 1430 and a personal computer 1440 are respectively connected to the video signal output terminal 1312 and the input and output terminal 1314 for data communication as necessary. Then, by a predetermined operation, the imaging signal stored in the memory 1308 is output to the television monitor 1430 and the personal computer 1440.

The aforementioned sensor device 1 functioning as a gyro sensor is built-in in the digital still camera 1300.

In addition, in addition to the personal computer (mobile personal computer) in FIG. 8, the mobile phone in FIG. 9, the digital still camera in FIG. 10, the electronic apparatus of the invention may be applied to, depending on the kind of the electronic device, for example, a vehicle body attitude detection apparatus, a pointing device, a head-mounted display, an ink-jet type ejection device (for example, an ink jet printer), a personal laptop computer, a TV, a video camera, a video tape recorder, a navigation device, a pager, an electronic organizer (also with communication function), an electronic dictionary, a calculator, an electronic game device, a game controller, a word processor, a workstation, a videophone, a television monitor for security, an electronic binoculars, a POS terminal, a medical equipment (for example, an electronic thermometer, a blood pressure gauge, a blood glucose meter, an electrocardiogram measuring device, an ultrasonic diagnostic apparatus and an electronic endoscope), a fish finder, various measuring instruments, gauges (for example, gauges of a vehicle, an aircraft and a ship), a flight simulator.

Hitherto, the sensor device, the manufacturing method of a sensor device and the electronic apparatus of the invention have been described based on the illustrated embodiment, but the invention is not limited thereto.

Further, the configuration of each part in the sensor device and the electronic apparatus of the invention may be replaced with any configuration which exhibits a similar function, and any configuration may be added thereto.

Further, in the manufacturing method of a sensor device of the embodiment of the invention, any process may be added.

Further, in the aforementioned embodiment, a case where the sensor device has three sensor elements has been described as an example, but without being limited thereto, for example, the number of the sensor element that the sensor device has may be two or four or more.

Further, in the aforementioned embodiment, a case where the detection axes of a plurality of sensor element are orthogonal with each other has been described as an example, but the detection axes of a plurality of sensor element may be orthogonal with each other, but may not be necessarily orthogonal.

Further, in the aforementioned embodiment, a case where the main portion (base material) of the sensor element 30 is made of crystal has been described as an example, but without being limited thereto, the main portion (base material) of the sensor element 30 may be, for example, a piezoelectric body such as lithium tantalate ($LiTaO_3$), lithium tetraborate ($Li_2B_4O_7$), lithium niobate ($LiNbO_3$), lead zironate titante (PzT), zinc oxide (ZnO), aluminum nitride (AlN), or a semiconductor such as silicon (Si).

Further, the main portion of the sensor element 30 may be made of material (non-piezoelectric material) other than piezoelectric material, for example, silicon, quartz, and the like. In this case, the piezoelectric element may be provided in the detection vibrating arm and the drive vibrating arm.

Further, as the sensor element 30, it is possible to use a bipod tuning fork, a tripod tuning fork, H type tuning fork, or various gyro elements such as a comb type gyro element, an orthogonal gyro element, and a prismatic gyro element, in addition to the aforementioned double T type.

Further, in addition to the axis orthogonal to the main surface (plate surface) of the sensor element, the detection axis of the sensor element may be an axis parallel to the main surface of the sensor element.

Further, in the aforementioned embodiment, the configuration has been described in which the sensor element is fixed and supported to the package through the supporting member and the IC chip, but a configuration may be adopted in which the sensor element is fixed and supported to the package through the IC chip or directly without the supporting member.

Further, in the aforementioned embodiment, a case where the sensor device has three IC chips has been described as an example, but without being limited thereto, for example, it may be configured such that the driving and detection of a plurality of sensor elements are performed in one IC chip.

Further, in the aforementioned embodiment, the configuration in which the IC chip and the package are electrically connected through the flexible wiring substrate has been described as an example, but without being limited thereto, the electrical connection between the IC chip and the package may be, for example, a connection through a bonding wire, or a connection using face down mounting.

The entire disclosure of Japanese Patent Application No. 2012-089666, filed Apr. 10, 2012 is expressly incorporated by reference herein.

What is claimed is:

1. A sensor device comprising:
a supporting member configured to support a plurality of sensor elements;
a first sensor element which detects an angular velocity around a first detection axis, the first sensor element being arranged on a first leg of the supporting member that orients the first sensor element orthogonal to the first detection axis;
a second sensor element which detects an angular velocity around a second detection axis intersecting with the first detection axis, the second sensor element being arranged on a second leg of the supporting member that orients the second sensor element orthogonal to the second detection axis and orthogonal to the first sensor element; and
a third sensor element which detects an angular velocity around a third detection axis intersecting with the first detection axis and the second detection axis, the third sensor element being arranged on a third leg of the supporting member that orients the third sensor element orthogonal to the third detection axis and orthogonal to the first and second sensor elements,
wherein the first leg is orthogonal to the second leg and third leg, the second leg is orthogonal to the first leg and the third leg, and the third leg is orthogonal to the first leg and the second leg,
wherein a relationship fd1 >fd2 and fm1 <fm2 is satisfied, when a drive frequency of the first sensor element is set to fd1, a drive frequency of the second sensor element is set to fd2, a mistuned frequency of the first sensor element is set to fm1, and a mistuned frequency of the second sensor element is set to fm2, and wherein a relationship fd1 >fd2 >fd3 and fm1 <fm2 <fm3 is satisfied when a drive frequency of the third sensor element is set to fd3 and a mistuned frequency of the third sensor element is set to fm3.

2. The sensor device according to claim 1,
wherein a difference between a noise density of a sensor output of the first sensor element and a noise density of a sensor output of the second sensor element is 0 [deg·s−1/√Hz] or more and 0.0003 [deg ·s−1/√Hz] or less.

3. The sensor device according to claim 1,
wherein a difference between a drive frequency fd1 of the first sensor element and a drive frequency fd2 of the second sensor element is 3 kHz or more and 30 kHz or less.

4. The sensor device according to claim 1,
wherein relationship fd1 <fs1 and fd2 <fs2, or fd1 >fs1 and fd2 >fs2 is satisfied, when a detection frequency of the first sensor element is set to fs1 and a detection frequency of the second sensor element is set to fs2.

5. The sensor device according to claim 1,
wherein the first sensor element and the second sensor element each has a base portion, a vibrating arm which is extended from the base portion and is caused to drive and vibrate, and a mass adjusting film provided in the vibrating arm.

6. The sensor device according to claim 5,
wherein the first sensor element and the second sensor element each has a detection vibrating arm which is extended from the base portion, and in which the detection vibration is excited.

7. The sensor device according to claim 1, wherein the first detection axis and the second detection axis are perpendicular to each other.

8. The sensor device according to claim 1,
wherein a difference between a noise density of a sensor output of the second sensor element and a noise density of a sensor output of the third sensor element is 0 [deg·s−1/√Hz] or more and 0.0003 [deg·s−1/√Hz] or less.

9. The sensor device according to claim 1,
wherein a difference between the drive frequency fd2 of the second sensor element and the drive frequency fd3 of the third sensor element is 3kHz or more and 30kHz or less.

10. The sensor device according to claim 1,
wherein relationship $fd2 < fs2$ and $fd3 < fs3$, or relationship $fd2 > fs2$ and $fd3 > fs3$ is satisfied, when a detection frequency of the second sensor element is set to $fs2$ and a detection frequency of the third sensor element is set to $fs3$.

11. A manufacturing method of a sensor device which includes a first sensor element which detects an angular velocity around a first detection axis, a second sensor element which detects an angular velocity around a second detection axis intersecting with the first detection axis, and a third sensor element which detects an angular velocity around a third detection axis intersecting with the first detection axis and the second detection axis, wherein a relationship $fd1 > fd2$ is satisfied when a drive frequency of the first sensor element is set to $fd1$ and a drive frequency of the second sensor element is set to $fd2$, the manufacturing method comprising:
providing a supporting element that is configured to support a plurality of sensor elements;
preparing the first sensor element, the second sensor element, and the third sensor element such that the first sensor element is arranged on a first leg of the supporting member that orients the first sensor element orthogonal to the first detection axis, such that the second sensor element is arranged on a second leg of the supporting member that orients the second sensor element orthogonal to the second detection axis and orthogonal to the first sensor element, and such that the third sensor element is arranged on a third leg of the supporting member that orients the third sensor element orthogonal to the third detection axis and orthogonal to the first and second sensor elements; and
adjusting a mistuned frequency of at least one sensor element out of the first sensor element, the second sensor element, and the third sensor element,
wherein the first leg is orthogonal to the second leg and third leg, the second leg is orthogonal to the first leg and the third leg, and the third leg is orthogonal to the first leg and the second leg,
wherein in the adjusting of the mistuned frequency, the adjustment is performed to satisfy the relationship $fm1 < fm2$, when a mistuned frequency of the first sensor element is set to $fm1$ and a mistuned frequency of the second sensor element is set to $fm2$, and
a relationship $fd1 > fd2 > fd3$ and $fm1 < fm2 < fm3$ is satisfied when a drive frequency of the third sensor element is set to $fd3$ and a mistuned frequency of the third sensor element is set to $fm3$.

12. An electronic apparatus comprising:
a housing; and
the sensor device according to claim 1 located within the housing.

13. An electronic apparatus comprising:
a housing; and
the sensor device according to claim 2 located within the housing.

14. An electronic apparatus comprising:
a housing; and
the sensor device according to any one of claim 3 located within the housing.

15. An electronic apparatus comprising:
a housing; and
the sensor device according to claim 4 located within the housing.

16. An electronic apparatus comprising:
a housing; and
the sensor device according to claim 5 located within the housing.

17. An electronic apparatus comprising:
a housing; and
the sensor device according to claim 6 located within the housing.

18. An electronic apparatus comprising:
a housing; and
the sensor device according to claim 7 located within the housing.

* * * * *